United States Patent

[11] 3,602,051

[72] Inventor Emery E. Olah
Des Plaines, Ill.
[21] Appl. No. 45,168
[22] Filed June 9, 1970
[45] Patented Aug. 31, 1971
[73] Assignee Motorola, Inc.
Franklin Park, Ill.

[54] PUSHBUTTON TUNING MECHANISM
11 Claims, 10 Drawing Figs.

[52] U.S. Cl. .......... 74/10.35, 74/10.6, 74/10.39, 334/7
[51] Int. Cl. .......... F16h 35/18
[50] Field of Search .......... 74/10.6, 10.33, 10.31, 10.29, 10.27, 10.37, 10.35, 10.39; 334/7

[56] References Cited

UNITED STATES PATENTS 2,253,433 8/1941 Kellogg .......... 74/10.37

*Primary Examiner*—Milton Kaufman
*Attorney*—Mueller & Aichele

ABSTRACT: The pushbutton tuning mechanism for operating the tuner of a radio receiver includes a tuning slide, with five triangularly shaped apertures therein, for lateral movement in accordance with the tuning of the receiver. Corresponding to each of the triangular apertures in the tuning slide is a pushbutton slide mechanism having a memory plate with a similar triangularly shaped aperture overlying a corresponding aperture in the tuning slide. Each memory plate is positioned laterally in the direction of the movement of the tuning slide by a floating pin when the pushbutton is pulled out to release a clamp and then pushed back in, with the pin aligning the memory plate aperture with the aperture in the tuning slide. The memory plate then is clamped into position upon full depression of the pushbutton. Subsequent depression of the pushbutton causes the pin to position the tuning slide in accordance with the clamped position of the memory plate to thereby tune the radio receiver to the preselected station corresponding to the depressed pushbutton.

INVENTOR
EMERY E. OLAH

BY Mueller & Aichele
ATTORNEYS

PUSHBUTTON TUNING MECHANISM

BACKGROUND OF THE INVENTION

With the present trend to reduction in the size of the electronic components of a radio receiver, the size of a receiver incorporating such components may be diminished accordingly. As a result, it is desirable to reduce the size of the mechanical components of the receiver in order to take full advantage of this space savings resulting from the reduced size of the electronic components. This is especially true with respect to the pushbutton tuning mechanisms used in automobile radios and the like.

In addition, the pushbutton mechanisms normally associated with such radios are relatively complex and expensive mechanical devices. As a result it also is desirable to reduce the complexity of the pushbutton mechanism in order to effect a corresponding reduction in the cost of the radio receiver.

SUMMARY OF THE INVENTION

Accordingly, it is an object of this invention to provide an improved pushbutton mechanism for a wave signal receiver.

It is another object of this invention to reduce the size and complexity of the pushbutton mechanism of a wave signal receiver.

In accordance with a preferred embodiment of this invention a pushbutton selection mechanism for the tuner of a wave signal receiver includes a tuning slide member, having a plurality of oblique cam surfaces thereon, which is laterally positionable in accordance with the tuning of the receiver. A pushbutton slide member is positioned for movement transversely to the direction of movement of the tuning slide member and has a memory plate coupled therewith, with the memory plate having a plurality of corresponding oblique cam surfaces which correspond to similar surfaces on the tuning slide member. The pushbutton slide member carries a cam engaging member which effects alignment of the cam surfaces on the memory plate member and the tuning slide member upon movement of the pushbutton from a first to a second position. In addition, a clamping member is provided for locking the memory plate member in a predetermined lateral position with respect to the pushbutton slide member; so that with the memory plate member in a locked position, the cam engaging member causes the tuning slide member to move and to be aligned with the memory plate member upon depression of the pushbutton.

A provision is made for releasing the clamping member, so that movement of the pushbutton slide member from the first to the second position then causes the memory plate member to move laterally to be aligned with the corresponding cam surfaces on the tuning slide member. This resets the memory plate member of the pushbutton to a position corresponding to the tuning previously effected by the tuning slide means, so that subsequent depression of the pushbutton from the first position to the second position, following locking of the memory plate member, causes the tuning slide means to be moved to align the cam surfaces thereon with the corresponding surfaces on the memory plate member.

DETAILED DESCRIPTION

Figure 1:
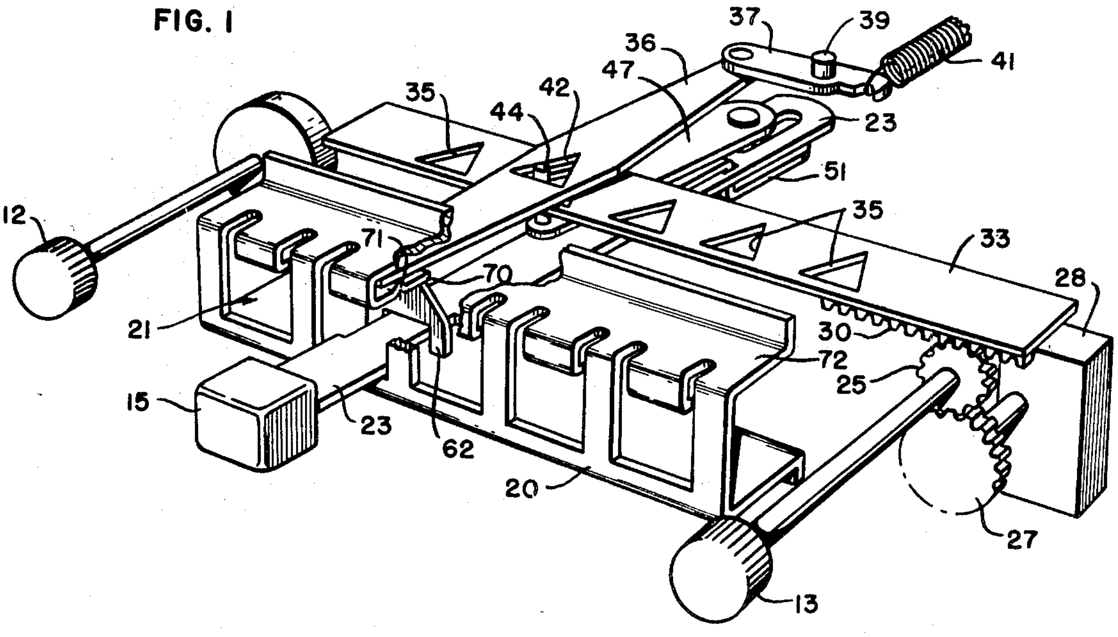
FIG. 1 is a partially cutaway perspective view of a pushbutton assembly in accordance with a preferred embodiment of this invention.
Figure 2:
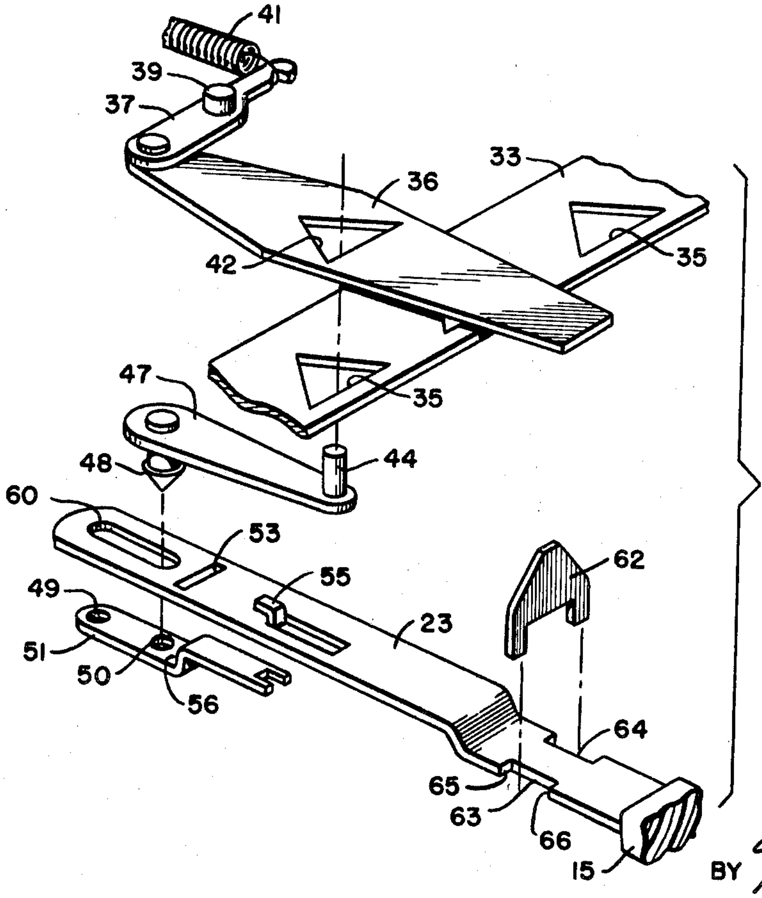
FIG. 2 is an exploded view of a portion of the mechanism shown in FIG. 1.

Referring now to the drawings, wherein like reference numbers are used throughout the several figures to denote the same or similar elements, there is shown in FIG. 1 a perspective view of a portion of a five station pushbutton radio receiver tuning mechanism, including a pair of control knobs 12 and 13 for controlling the volume and manual tuning of the receiver in a conventional manner. In addition to the manual tuning knob 13, there are provided five pushbuttons 14, 15, 16, 17 and 18 (most clearly shown in FIG. 3) for tuning the receiver to five preselected stations in accordance with the setting of a memory plate 36 associated with each of the pushbuttons 14–18.

The manner of operating the pushbuttons 14–18 is the same as that conventionally employed in pushbutton radios, where depression of the pushbutton causes the preset station to be selected by the tuner and pulling the button out to an extended position and pushing it in again causes the memory plate 36 to be set in accordance with a station which has been tuned under control of the manual tuning knob 13. Subsequent depression of the pushbutton then causes the same station thereafter to be selected.

For purposes of clarity, only a single pushbutton 15 with its associated mechanism is shown in FIG. 1. The pushbutton 15 and the associated slide mechanism is mounted in a pushbutton frame 20 having five pushbutton slide apertures 21 for accommodating each of the five slide mechanisms associated with the pushbuttons 14–18. The pushbutton frame 20 along with the frame for supporting the control knobs 12 and 13 is mounted within part of an overall frame of chassis (not shown) which provides support and relative location for the parts illustrated in the figures of the drawings.

Figure 7:
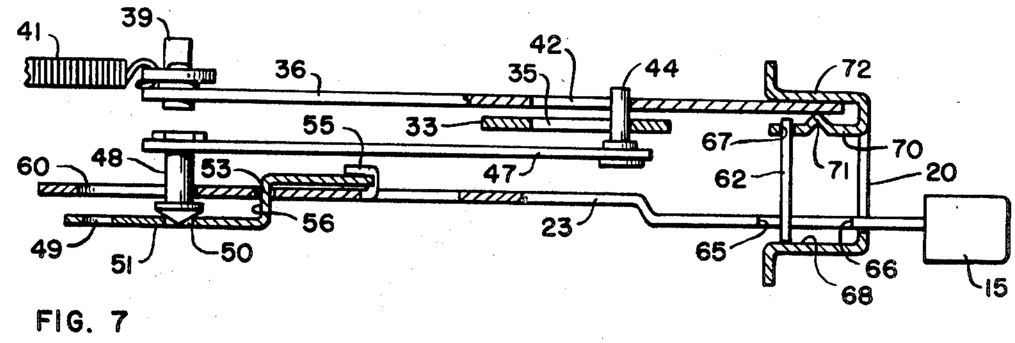
FIGS. 7, 8, 9 and 10 illustrate the operation of the mechanism shown in FIGS. 1—6.

Each of the pushbuttons 14–18 is attached to one end of an identical slide member 23 which is guided in support by the sides of the corresponding slide aperture 21 through which the slide member 23 extends. Each of the slide members 23 is located or biased to a central position with respect to the pushbutton frame 20 by any suitable mechanism, not shown, such as coil springs or the like to provide a neutral or unoperated position for the pushbuttons 14–18 and the associated slide members 23, position of the pushbuttons 14–18 as best illustrated in FIGS. 1, 3 and 7.

Manual tuning of the radio receiver under control of the knob 13 rotates a gear 25, which in turn rotates a gear 27 to effect the tuning within a conventional tuner 28. Rotation of the gear 25 also operates a rack gear 30, attached to a tuning slide 33, to move the slide 33 laterally in accordance with the direction of rotation of the tuning knob 13 and the gear 25. The maximum movement of the tuning slide 33 in either direction corresponds to the limits of rotation of the gear 27 for the tuner 28 to effect tuning across the entire band of frequencies which the radio receiver is to receive. It also should be noted that the tuning slide 33 is restrained against movement in any other direction by any suitable means, such as s guide channel (not shown).

Figure 3:
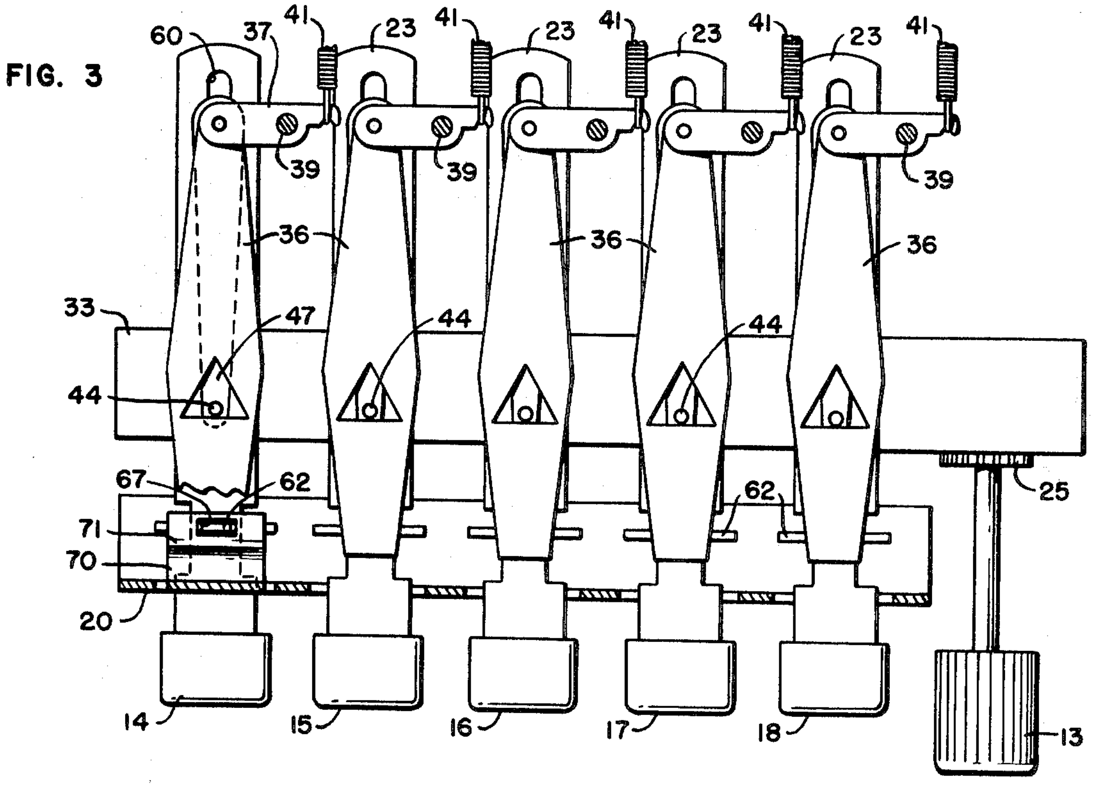
FIG. 3 is a top view of a portion of the pushbutton assembly shown in FIG. 1.

Located in the tuning slide 33, at positions substantially aligned with the center of each of the pushbutton slide members 23, are five triangularly shaped apertures 35, with the base of each triangularly shaped apertures being located facing the pushbutton frame 20 and the apex extending toward the rear of the mechanism as viewed in FIGS. 1 and 3. Located directly above each of the apertures 35 in the tuning slide 33 are memory plates 36, which are pivotally mounted at the ends remote the pushbuttons 14–18 on levers 37, which in turn are mounted on pivot members 39 attached to the frame (not shown) in which the pushbutton mechanism is mounted. Each of the memory plates 36 is biased toward the pushbutton frame 20 through the lever 37 by means of a coil spring 41, one end of which is attached to the lever 37 and the other end of which is attached to the frame not shown) housing the tuning mechanism. Each of the memory plates 36 also has a triangularly shaped aperture 42 located in substantial alignment with a corresponding aperture 35 in the tuning slide 33 when the tuning slide 33 is located in its central position midway between the two extremes to which it can be moved laterally.

In order to effect selective resetting of the memory plates 36 and to effect tuning under control of the depression of a selected pushbutton 14–18, a locating pin 44 extends upwardly through each of the overlapping sets of apertures 35 and 42 in the tuning slide 33 and the memory plates 36 for each pushbutton location. The locating pins 44 each are attached to one end of floating levers 47, the other ends of which pivot about detent pins 48 in one of two holes 49 or 50 located in detent springs 51, attached to the pushbutton slide members 23.

The detent springs 51 are inserted through apertures 53 formed in the slide members 23, with bifurcated ends of the springs 51 engaging retaining tabs 55 formed in the pushbutton slide members 23, Shoulders 56 on the springs 51 abut the edges of the slots 53 to prevent movement of the springs 51 once the spring is mounted into place and the tab 55 is bent over to the position shown most clearly in FIGS. 2 and 7–10. Movement of the detent pins 48 from one to the other of the detent holes 49 or 50 is permitted by passing the detent pins 48 through longitudinal slots 60 in the slide members 23.

Each pushbutton slide mechanism is completed by a clamp actuator 62 which is in the form of a generally A-shaped member having a pair of downwardly extending legs which straddle each side of a pair of actuator slots 63 and 64 forming a narrowed neck portion on the forward part of the pushbutton slide members 23 near the end to which the pushbuttons are attached. The ends of the slots 63 and 64 are terminated by rear shoulders 65 and by front shoulders 66 (shown most clearly in FIG. 2). The clamp actuators 62 are freely mounted without attachment by straddling the legs thereof over the neck formed by the slots 63 and 64 and by extending the apex or top into corresponding actuator slots 67 formed in clamping springs 70 (most clearly shown in FIGS. 3 and 7–10), causing the clamp actuators 62 to be captivated within the assembly.

With the pushbutton in its normal position following the setting of the memory element the legs of the clamp actuators 62 rest on a rearwardly extending support surface 68 formed as part of the pushbutton frame 20. The upper portions of the actuators 62 then force upwardly, as shown most clearly in FIGS. 7 and 10, the clamping springs 70 to cause clamping ridges 71 formed in the clamping springs to wedge the forward extending end of the corresponding memory plates 36 between the ridges 71 and the lower side of a rearwardly extending plate 72 formed as part of the pushbutton frame 20. Thus, with a clamp actuator 62 located in its vertical position, the corresponding memory plate 36 is locked or clamped into place against movement.

Referring now to FIGS. 3–6, there is shown a top view of a portion of the pushbutton mechanism, illustrating the manner in which the memory plates 36 are located relative to the tuning slide 33. In FIG. 3 all five pushbuttons 14–18 with the associated memory plates 36 are shown in central locations, with the tuning slide 33 also being adjusted to its central location with respect to the left and right lateral movement thereof. In this position, the apertures 42 in the memory plates 36 are aligned with and directly overlie corresponding apertures 35 in the tuning slide 33; so that depression of any of the pushbuttons 14–18, causing it to move upwardly as viewed in FIG. 3, has no affect on either the location of the tuning slide 33 or of the corresponding memory plate 36.

Figures 4, 5, 6:
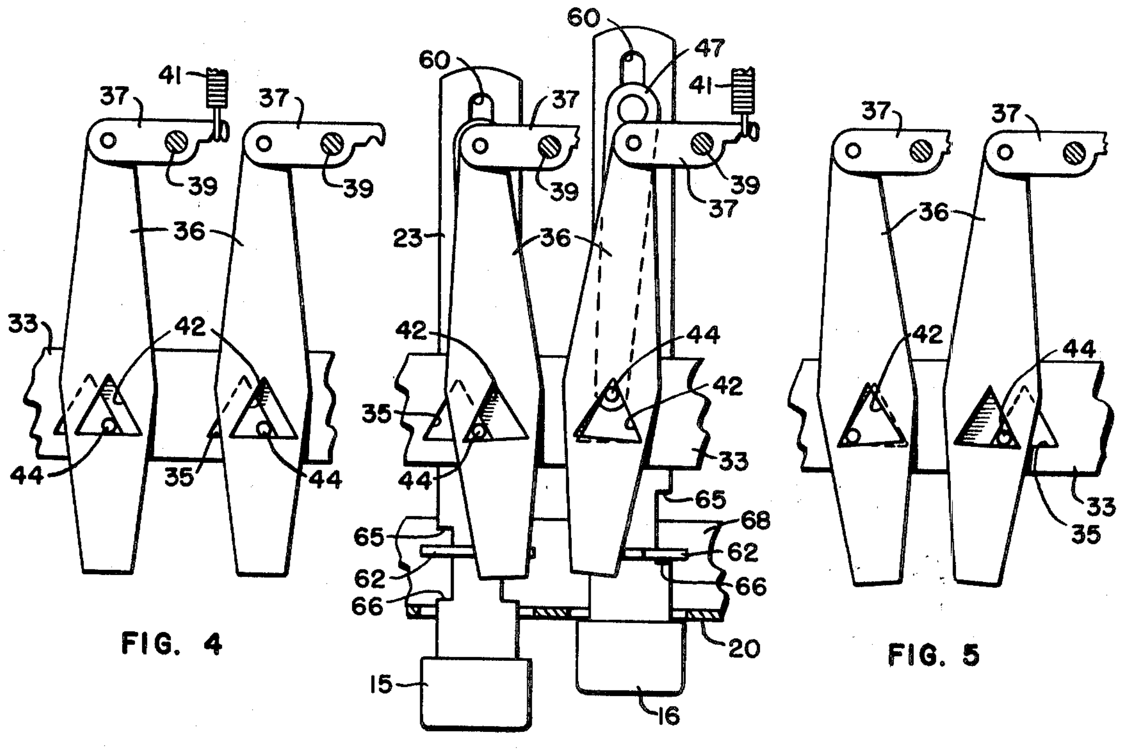
FIGS. 4, 5 and 6 are top views of portions of the pushbutton assembly shown in FIG. 3.

In FIG. 4 the portion of the apparatus shown in FIG. 3 is illustrated, with the tuning slide 33 being moved to its leftmost extreme position, showing the manner in which the apertures 35 in the tuning slide 33 then are caused to be offset from the apertures 42 in the memory plates 36. It is to be noted that in this position the locating pins 44 remain substantially centrally located with respect to the center line of the memory plates 36, but are located in the right rear corners of the apertures 35 in the tuning slide 33. Depression of a corresponding pushbutton then causes the corresponding slide locating pin 44 first to engage the right oblique camming surface formed by the aperture 35 in the tuning slide 33 and to follow that camming surface until it engages the left oblique camming surface in the aperture 42 formed in the corresponding memory plate 36 associated with the pushbutton so moved.

Upon engagement of the left oblique camming surface on the memory plate 36, the locating pin 44 then is wedged in the "V" formed between the left camming surface of the memory plate 36 and the corresponding right camming surface of the aperture 35 in the tuning slide 33. If the memory plate 36 is clamped against movement, continued rearward movement (upward as viewed in FIG. 4) of the pushbutton slide member 23 carrying the locating pin 44 than forces the tuning slide 33 toward the right as viewed in FIG. 4, until the slide locating pin 44 is located at the apexes of the "V's" formed by the left and right oblique camming surfaces in the triangular apertures 35 and 42. Such a position is shown in conjunction with the pushbutton 16 in FIG. 6. Thus the tuning slide 33 is moved to the right to a position corresponding to the setting of the memory plate 36.

In FIG. 5 two adjacent memory plates 36 are shown moved to their extreme right and extreme left positions, with the left memory plate 36 being moved to the extreme right position and the right memory plate 36 being moved as far to the left as is possible in the tuning apparatus shown. The sides of the memory plates 36 extending toward the front of the tuning mechanism on which the pushbuttons are located are tapered in order to prevent interference between adjacent memory plates 36 when they are positioned to extremes as shown in FIG. 5. The tuning slide 33 illustrated in FIG. 5 also is shown moved to its extreme right position, so that the apexes of the triangular aperture 42 in the left-hand memory plate 36 and the corresponding aperture 35 in the tuning slide 33 are in alignment. It can be seen that the other extreme position afforded by the right-hand tuning memory plate 36 provides sufficient clearance for the slide locating pin 44 associated therewith to prevent interference with the movement of the tuning slide 33 under the control of a different memory plate 36.

In FIG. 6 a pushbutton 16 is shown fully depressed, illustrating the manner in which the pushbutton slide member 23 moves to the rear, carrying with it the floating lever arm 47 to cause the slide locating pin 44 to engage the apexes of the apertures 42 and 35, respectively, in the memory plate 36 and the tuning slide 33 to force the tuning slide 33 to be moved to a location determined by the location of the apex of the triangular aperture 42 in the associated memory plate 36. In FIG. 6 it may be seen with reference to the left one of the two pushbuttons mechanisms, that the locating pin 44 on the left mechanism is afforded sufficient clearance when the tuning slide 33 is moved to its left extreme position. Under normal conditions of operation, adjacent pushbuttons would ordinarily not be used to move the tuning slide 33 to its two extreme positions or limits; but since this is a possibility which could occur in use, it is illustrated in FIGS. 5 and 6 to indicate the sufficient clearance provided between the parts of adjacent pushbutton tuning mechanisms to permit such operation.

FIGS. 7, 8, 9 and 10 illustrate the manner in which the memory plates 36 may be reset to align and lock a memory plate 36 into new position corresponding to a position of the tuning slide 33 selected under control of the tuning control knob 13. FIG. 7 illustrates the location of the various parts of a pushbutton mechanism in its neutral or unoperated state, with the pushbutton 15 biased to a central position by means of a biasing spring (not shown) which may be attached to the pushbutton slide member 23. In this position, the clamp actuator 62 wedges the ridge 71 against the memory plate 36 to clamp it between the ridge 71 and the lower surface of the plate 72 to lock the memory plate against movement. The detent pin 48 rides in the circular aperture 50 in the detent spring 51 to provide a pivot point for rotation of the lever arm 47 carrying the slide locating pin 44 for the mechanism shown in FIG. 7. The locating pin 44 is positioned near the base of the triangular apertures 42 and 35 to permit lateral movement of the tuning slide 33 in a plane which is normal to the cross-sectional view shown in FIG. 7.

Figure 8:
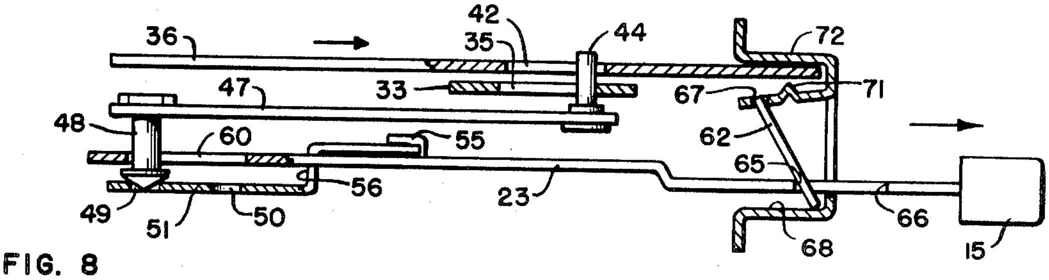

If a station then is selected under control of the manual tuning knob 13 which it is desired to transfer to a memory plate 36 for future selection by depression of the pushbutton 15, the pushbutton 15 is pulled outwardly toward the right as viewed in FIG. 8. The shoulders 65 on the slots 63 and 64 then engage the legs of the clamp actuator 62 to tip it as shown in FIG. 8, releasing the spring 70 and causing the ridge 71 to disengage the memory plate 36. The memory plate 36 is then free for lateral movement toward the left and right as viewed in FIGS. 3, 4, 5 and 6, or normal to the plane of the views shown in FIGS. 7–10. Under the urging of the takeup spring 41, the memory plate 36 also moves slightly to the right to offset the aperture 42 from the corresponding aperture 35 in the direction of the arrow shown above the memory plate 36 in FIG. 8.

As the rightward movement of the pushbutton 15 causes the release of the spring 70 to release the memory plate 36, the slide locating pin 44 engages the base of the triangular aperture 35 in the tuning slide 33 to prevent rightward movement of the floating lever 47. Thus, continued rightward movement of the pushbutton slide member 23 causes the detent pin 48 to ride up out of the circular aperture 50 in the detent spring 51 until the spring 51 moves sufficiently far to the right to enable the detent pin 48 to engage the aperture 49. The slot 60 in the slide member 23 is chosen to be of sufficient length to permit this movement of the detent pin 48 between the apertures 50 and 49 in the spring 51 in this manner.

Figure 9:
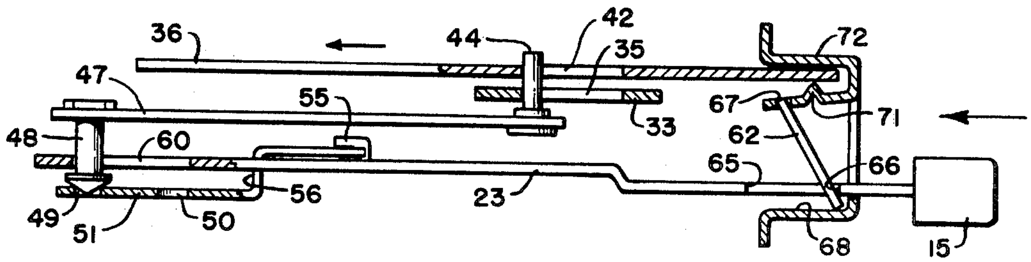

Once the actuator clamp has released the lock on the memory plate 36 as shown in FIG. 8 the pushbutton 15 then may be depressed, moving toward the left as shown in FIG. 9. In moving the pushbutton 15 from the position shown in FIG. 8 to the position shown in FIG. 9, the clamp actuator 62 remains in the released position, to which it has been placed by pulling out the pushbutton 15, until the shoulder 66 engages the legs on the clamp actuator 62. During this movement the slide locating pin 44 is moved from its extreme right position, as shown in FIG. 8, to an extreme left position, as shown in FIG. 9, where it engages the apexes or "V's" of the triangles formed by the oblique camming surfaces in the apertures 35 and 42 in the tuning slide 33 and the memory plate 36.

At the time the pin 44 is moved from the position shown in FIG. 8 to the position shown in FIG. 9, it causes the memory plate 36 to be moved laterally to align the apex of the aperture 42 with the apex of the aperture 35 in the tuning slide 33. The tuning slide 33 has sufficient friction, compared to the very low friction pivotal mounting of the memory plate 36 in the unclamped condition shown in FIGS. 8 and 9, to prevent lateral movement of the tuning slide 33 as the memory plate 36 is moved into lateral alignment with the position of the tuning slide 33. Accurate alignment of the memory plate 36 is ensured since the pin 44 enters the apex of the aperture 42 first and then moves the memory plate 36 to the left against the urging of the spring 41 until the pin 44 engages the apex of the aperture 35 in the tuning slide 33.

When the locating pin 44 engages the apex of the aperture 35 in the tuning slide 33, further movement of the pin 44 to the left is inhibited. Continued depression of the pushbutton 15 then causes the pushbutton slide member 23 to continue moving to the left from the position shown in FIG. 9 to the terminal position shown in FIG. 10, with the locating pin 44 engaging the apex of the aperture 35 in the tuning slide 33 holding the floating lever 47 in the position shown in FIG. 9; so that the detent pin 48 rides up out of the circular aperture 49 and slides over the portion of the detent spring 51 between the apertures 49 and 50 until the end of the detent pin 48 drops into the circular aperture 50 in the detent spring 51.

Figure 10:
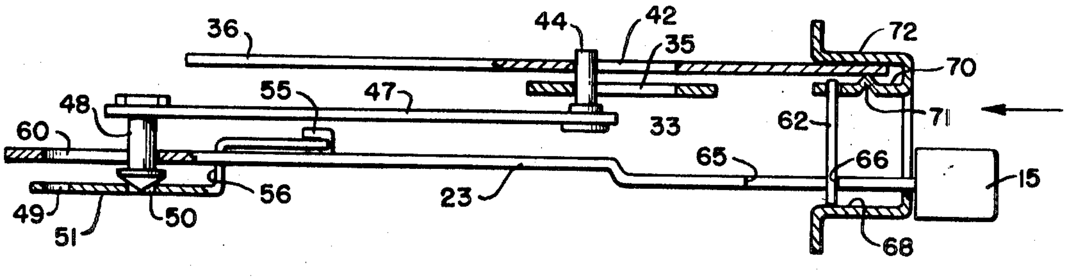

At the same time, the shoulder 66 engages the legs at the bottom of the clamp actuator 62 causing the legs to be moved to the left as viewed in FIGS. 9 and 10, forcing the clamp actuator 62 into the upright position shown in FIG. 10. In this position, the clamping spring 70 is moved back to its initial position, causing the ridge 71 to clamp the memory plate 36 between the ridge 71 and the lower surface of the plate 72. This locks the memory plate 36 into the position to which it had been moved under the control of the locating pin 44. Release of the pushbutton 15 then causes the slide member 23 to be returned to the position shown in FIG. 7 under the control of the return springs (not shown), readying the pushbutton apparatus for further use.

If the tuning slide 33 is then moved either to the right or to the left (as viewed in FIGS. 3–6) of the position used to set the memory plate 36 in the manner just described, subsequent depression of the pushbutton 15 from the position shown in FIG. 7 directly to the position shown in FIG. 10 causes locating pin 44 to engage corresponding camming surfaces on the apertures 42 and 35 to move the tuning slide 33 in the manner described previously in conjunction with FIGS. 3, 4, 5 and 6. The memory plate 36 remains clamped or locked into the position to which it had been set; so that it does not move, and the friction of the tuning slide 33 is overcome, to position the tuning slide in accordance with the location of the aperture 42 to the memory plate 36.

The memory plate 36 is biased to the right when it is released for resetting, as described in conjunction with FIG. 8, in order to avoid the critical tolerances which otherwise would be necessitated in the alignment of the apertures 42 and 35. Since an accurate alignment of all five apertures 35 with corresponding apertures 42 in each of the five memory plates 36 would be extremely difficult to achieve in the assembly of the devices, the spring biasing to the right of the memory plates 36 permits accurate alignment of the apexes of the triangles formed by the apertures 42 and 35 when the memory plates 36 are reset or relocated, as shown in FIGS. 8 and 9, without the necessity of building the mechanism with close tolerances.

At any time it is desired to reset a memory plate 36 associated with any one of the pushbuttons 14–18, the procedure shown in FIGS. 7–10 may be repeated. Any one of the memory plates 36 is settable to correspond to any one of the lateral locations between the extreme left and extreme right lateral movement of the tuning slide 33. It should be noted that when the tuning slide 33 is moved to the left or to the right under control of the depression of a pushbutton 14–18, the rack gear 30 operates through the gears 25 and 27 to tune the tuning mechanism 28 in the same manner as if the tuning knob 13 were rotated to effect tuning. Suitable declutching of a conventional nature for the tuning knob 13 may be employed when depression of a pushbutton 14–18, is used to effect the tuning, if so desired. Such declutching, however, does not form a part of this invention.

I claim:

1. A pushbutton selection mechanism for the tuner of a wave signal receiver having a pushbutton memory including in combination:

- tuning slide means laterally positionable in accordance with the setting of the tuner of said receiver and having a plurality of oblique cam surfaces thereon;
- pushbutton slide means positioned for movement transversely to the direction of movement of the tuning slide means;
- memory plate means for the pushbutton slide means and having a plurality of oblique cam surfaces each corresponding to different cam surfaces on the tuning slide means; and
- cam surface engaging means carried by the pushbutton slide means for engaging corresponding cam surfaces on the tuning slide means and the memory plate means upon movement of the pushbutton slide means from a first position to a second position, substantially aligning the corresponding cam surfaces on the memory plate means and the tuning slide means.

2. The combination according to claim 1 wherein the plurality of oblique cam surfaces include first and second cam surfaces in the tuning slide means and in the memory plate means forming corresponding V-shaped slots in the tuning slide means and in the memory plate means, with the cam surface engaging means extending into the openings of the corresponding slots and being moved toward the apexes of the slots when the pushbutton slide means is moved from said first position to said second position.

3. The combination according to claim 2 wherein the cam surface engaging means includes a floating lever pivotally mounted on the pushbutton slide means at one end and a pin mounted at the other end, with the pin extending into the openings of the corresponding V-shaped slots.

4. The combination according to claim 1 wherein the memory plate means is laterally movable in the direction of movement of the tuning slide means and further including means engaging and releasably locking the memory plate means in a predetermined lateral position, the cam surface engaging means laterally displacing the tuning slide means upon movement of the pushbutton slide means from said first position to said second position with the memory plate means locked in position to align the cam surfaces of the memory plate means, and laterally displacing the memory plate means to align the cam surfaces thereof with the corresponding cam surfaces of the tuning slide means with the memory plate means being released.

5. The combination according to claim 4 further including means responsive to movement of the pushbutton slide means from said first position to a third position for releasing the locking means permitting said lateral displacement of the memory plate means, with subsequent movement of the pushbutton slide means from said third position through said first position to said second position reengaging the locking means to hold the memory plate means in the lateral position to which it has been displaced.

6. The combination according to claim 5 wherein movement of the pushbutton slide means from the third position to the second position causes the cam surface engaging means to engage corresponding cam surfaces on the tuning slide means and the memory plate means to align the cam surfaces of the memory plate means with the corresponding cam surfaces of the tuning slide means, and further including means responsive to completion of the movement of the pushbutton slide means to the second position for reengaging the locking means to lock the memory plate means in the lateral position to which it is then located by the cam surface engaging means whereupon return of the pushbutton slide means to the first position moves the cam surface engaging means to a position permitting lateral displacement of the tuning slide means, subsequent movement of the pushbutton slide means from the first position to the second position causing the tuning slide means to be aligned with the cam surfaces of the memory plate means by the cam surface engaging means.

7. The combination according to claim 5 further including means for guiding movement of the pushbutton slide means from said first position to said second position in one direction and for guiding movement of the pushbutton slide means from said first position to said third position in a diametrically opposite direction.

The combination according to claim 7 further including resilient bias means biasing the memory plate means toward the direction of movement of the pushbutton slide means to the third position to misalign the cam surfaces of the memory plate means and the tuning slide means with the locking means being released, whereupon movement of the tuning slide means from the third position to the second position causes the cam surface engaging means to align the cam surfaces of the memory plate means and the tuning slide means against said resilient bias.

9. The combination according to claim 1 wherein the tuning slide means includes a plurality of sets of oblique cam surfaces with a corresponding plurality of pushbutton slide means, memory plate means for each pushbutton slide means, with the memory plate means each including a set of oblique cam surfaces corresponding to a different set of cam surfaces on the tuning slide means, with each of the plurality of pushbutton slide means carrying a different cam surface engaging means.

10. The combination according to claim 9 wherein the sets of oblique cam surfaces each are in the form of V-shaped slots in the tuning slide means and the memory plate means, the slots in each memory plate means substantially overlying corresponding slots in the tuning slide means, the cam surface engaging means including floating levers pivotally mounted on each pushbutton slide means at one end and a pin mounted on the other end of each lever, each pin extending into the openings of the corresponding V-shaped slots in the tuning slide means and the memory plate means.

11. The combination according to claim 10, wherein each locking plate means is laterally movable in the direction of movement of the tuning slide means and further including means for engaging and releasably locking each memory plate means in predetermined lateral position, each pin laterally displacing the tuning slide means upon movement of the corresponding pushbutton slide means from said first position to said second position with the corresponding memory plate means locked in position to align the slot of the tuning slide means with the corresponding slot of the memory plate means, and laterally displacing the corresponding memory plate means to align the slot thereof with the corresponding slot of the tuning slide means with the memory plate means being released.